United States Patent [19]

Mason et al.

[11] Patent Number: 5,721,498
[45] Date of Patent: Feb. 24, 1998

[54] BLOCK SEGMENTATION OF CONFIGURATION LINES FOR FAULT TOLERANT PROGRAMMABLE LOGIC DEVICE

[75] Inventors: William R. Mason, Colorado Springs, Colo.; Frederic C. Amerson, Los Altos, Calif.

[73] Assignee: Hewlett Packard Company, Palo Alto, Calif.

[21] Appl. No.: 570,035

[22] Filed: Dec. 11, 1995

[51] Int. Cl.⁶ ............................................. H03K 19/177
[52] U.S. Cl. ................................................ 326/38; 326/40
[58] Field of Search ............................. 326/38–41, 14.9

[56] References Cited

U.S. PATENT DOCUMENTS

| | | | |
|---|---|---|---|
| 4,020,469 | 4/1977 | Manning et al. | 340/172.5 |
| 4,855,954 | 8/1989 | Turner et al. | 326/39 |
| 4,870,302 | 9/1989 | Freeman | 326/41 |
| 5,336,951 | 8/1994 | Josephson et al. | 326/38 |
| 5,394,031 | 2/1995 | Britton et al. | 326/38 |
| 5,493,239 | 2/1996 | Zlotnick | 326/38 |

*Primary Examiner*—Edward P. Westin
*Assistant Examiner*—Jon Santamauro

[57] ABSTRACT

A programmable logic device (PLD) including a plurality of programmable tiles organized in blocks. Each block comprises a unique subset of the plurality of programmable tiles. A data bus extends to each of the blocks. An independent address circuit is provided within each block. A block select line is coupled to each block such that when the block select is line is asserted the address circuit of a selected block is capable of transferring data from the data bus to the plurality of programmable tiles and when the block enable line is deasserted the data bus is substantially electrically isolated from the address circuit and data bus.

19 Claims, 9 Drawing Sheets

BLOCK SEGMENTATION OF CONFIGURATION LINES FOR FAULT TOLERANT PROGRAMMABLE LOGIC DEVICE

BACKGROUND OF THE INVENTION

1. Related Applications

This application is related to co-pending application Ser. No. 08/570,040 filed on Dec. 12, 1995 assigned to the assignee of the present invention.

2. Field of the Invention

The present invention relates, in general, to programmable logic devices including field programmable gate arrays (FPGAs), and, more particularly, to an apparatus and method for loading data streams used to program FPGAs and for decreasing the amount of time needed to configure FPGAs.

3. Statement of the Problem

Programmable logic devices (PLDs) include programmable logic arrays (PLAs), field programmable gate arrays (FPGAs) and the like. In PLDs, configurable interconnects are used to connect logic elements, which may themselves be programmable, to each other and to input and output ports. To implement a desired circuit, PLDs must be given the information as to what connections are to be made and/or what logic is to be implemented by each of the logic elements. This is accomplished by applying a "configuration data stream" which is an ordered data stream in which each bit is represented by a binary value, to "configuration lines" formed on the PLD.

The configuration data stream is used to program individual switches inside the PLD to a desired state (i.e., on or off). These switches can be implemented from SRAM cells that control pass transistors, antifuse connection points, fuse connection points, or any other equivalent switch implementation. The programmed switches are used to control the configurable routing and logic of the PLD.

A typical PLD may comprise hundreds of programmable switches to accept and hold the configuration data stream. A continuing trend is to increase the logic capabilities of PLDs thereby increasing the number of programmable switches. Some devices employ thousands and tens of thousands of switches per PLD. These switches logically resemble a large addressable memory system with each switch uniquely identified by a column and row address.

In prior PLDs, all of the switches were arranged as a single array. A long shift register containing one bit for each column of switches in the array was used to hold the configuration data for a particular row. A second long shift register was used to load information as to which row in the array the data in the first shift register was to be loaded. Once both shift registers were loaded, all switches in a selected row could be programmed simultaneously by enabling the data in the first shift register to transfer into the programmable switches of the selected row.

Address lines must extend from the first and second shift registers across the entire array of switches in the prior configuration system. Also, each bit of both of the long shift registers must function or it may be impossible to load configuration data into the PLD.

All semiconductor fabrication technology is limited to a certain extent by background defect levels. As semiconductor devices become larger, yields decrease because it becomes more likely that a defect will exist in a particular device. Hence, as PLDs become larger, it is more likely that the long shift registers used in the prior art will be affected by a defect and hence fail to perform up to specifications. Also, it becomes more likely that defects will affect the long address lines required by the prior system. A need exists for a method and apparatus that allows large PLDs to be programmed while achieving reasonable yields in the face of background defect levels.

A fault tolerant system cannot tolerate a large amount of shared elements such as address lines and shift registers used in the prior art.

SUMMARY OF THE INVENTION

Briefly stated: the above problems are overcome by a programmable logic device (PLD) including a plurality of programmable tiles organized in logical blocks. Each logical block comprises a unique subset of the plurality of programmable tiles. A data bus extends to each of the blocks. An independent address circuit is provided for each block. A block select line is coupled to each block such that when the block select line is asserted the address circuit of a selected block is capable of transferring data from the data bus to the plurality of programmable tiles and when the block select line is deasserted the data bus is substantially electrically isolated from the logical block. Hence, failure of one logical block does not affect the remainder of the plurality of logical blocks.

The present invention also provides a method for loading a configuration data stream into a programmable logic device (PLD) having a plurality of storage devices. At least one block of storage devices of the PLD is selected. The at least one selected block comprises less than all of the storage devices in the PLD. Selected storage devices within the at least one selected block are addressed. A portion of the configuration data stream is loaded into the addressed storage devices. The processes of selecting, addressing, and loading are repeated until the configuration data stream is exhausted.

DETAILED DESCRIPTION OF THE DRAWING

Figure 1:
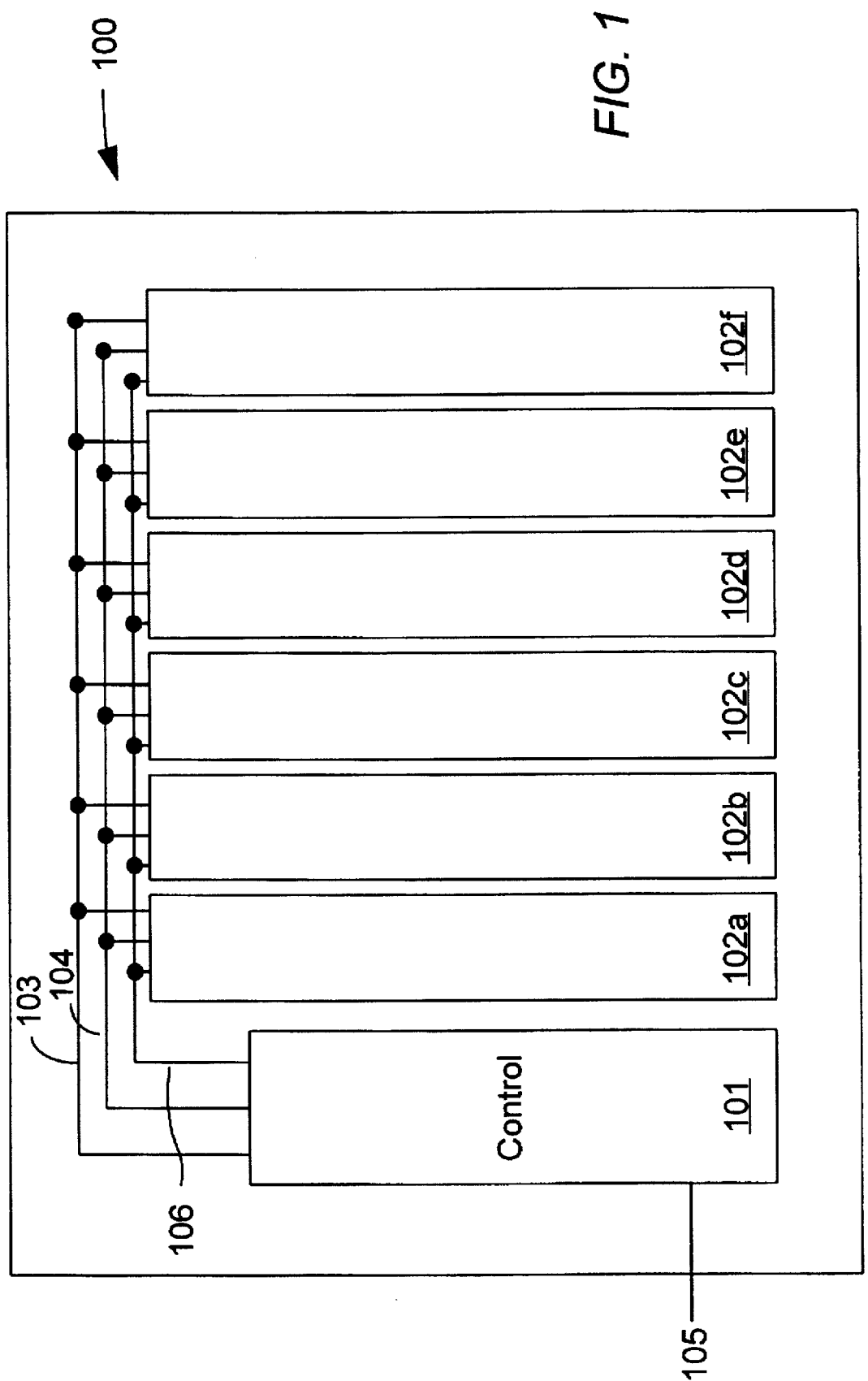
FIG. 1 shows a programmable logic device in accordance with the present invention in block diagram form.

1. Overview.

PLD 100 in accordance with the present invention comprises, among other things, a control circuit 101 and a plurality of substantially identical logical blocks 102a–102f. Control logic 101 serves general control functions such as clock generation and conducting communication between PLD 100 and external devices through I/O port 105. Control circuit 101 in accordance with the present invention provides at least three types of outputs to logic blocks 102a–102f. Data bus 103 comprises one or more wires carrying data used to configure logic blocks 102a–102f. Clock bus 104 carries clock information and may comprise one or more wires providing clock signals to logical blocks 102a through 102f. Enable bus 106 provides enable data to each of blocks 102a–102f allowing the logical blocks 102a–102f to be individually addressed.

An important feature of the present invention is that logical blocks 102a–102f are substantially identical, but substantially electrically independent. By electrically independent it is meant that should one block of the blocks 102a–102f fail due to a defect, the remaining logical blocks can still be configured and function normally. To do this, a failed logical block 102a–102f must not electrically load data bus 103, clock bus 104, or enable bus 106.

Each of logical blocks 102a–102f comprise a plurality of programmable logical elements (not shown) and/or programmable interconnections (not shown) for coupling the elements. The programmable elements and programmable interconnections include a plurality of storage devices, for example SRAM cells. The programmable elements, hence the storage devices, are arranged in an array such that each of the storage devices can be identified by a unique row and column address in the array. In this sense the array of switches is analogous to a memory array.

In the prior art, logical blocks 102a–102f were configured as a single array of switches. The data and address lines were "shared" resources in that many or all of the array of switches depended on the functionality of each of the data and address lines. Hence, a great number of address lines extended across the entire length and width of the chip. In contrast, each of logical blocks 102a–102f are substantially smaller than the entire chip. Hence, in accordance with the present invention the number of metal lines that must extend across the length of the chip is greatly reduced. This elimination or minimization of shared resources greatly improves the chip's sensitivity to manufacturing defects and improves yield substantially. The details of implementing the apparatus and method of PLD 100 in accordance with the present invention are described in greater detail hereinafter.

2. Block Selector Circuit.

Figure 2:
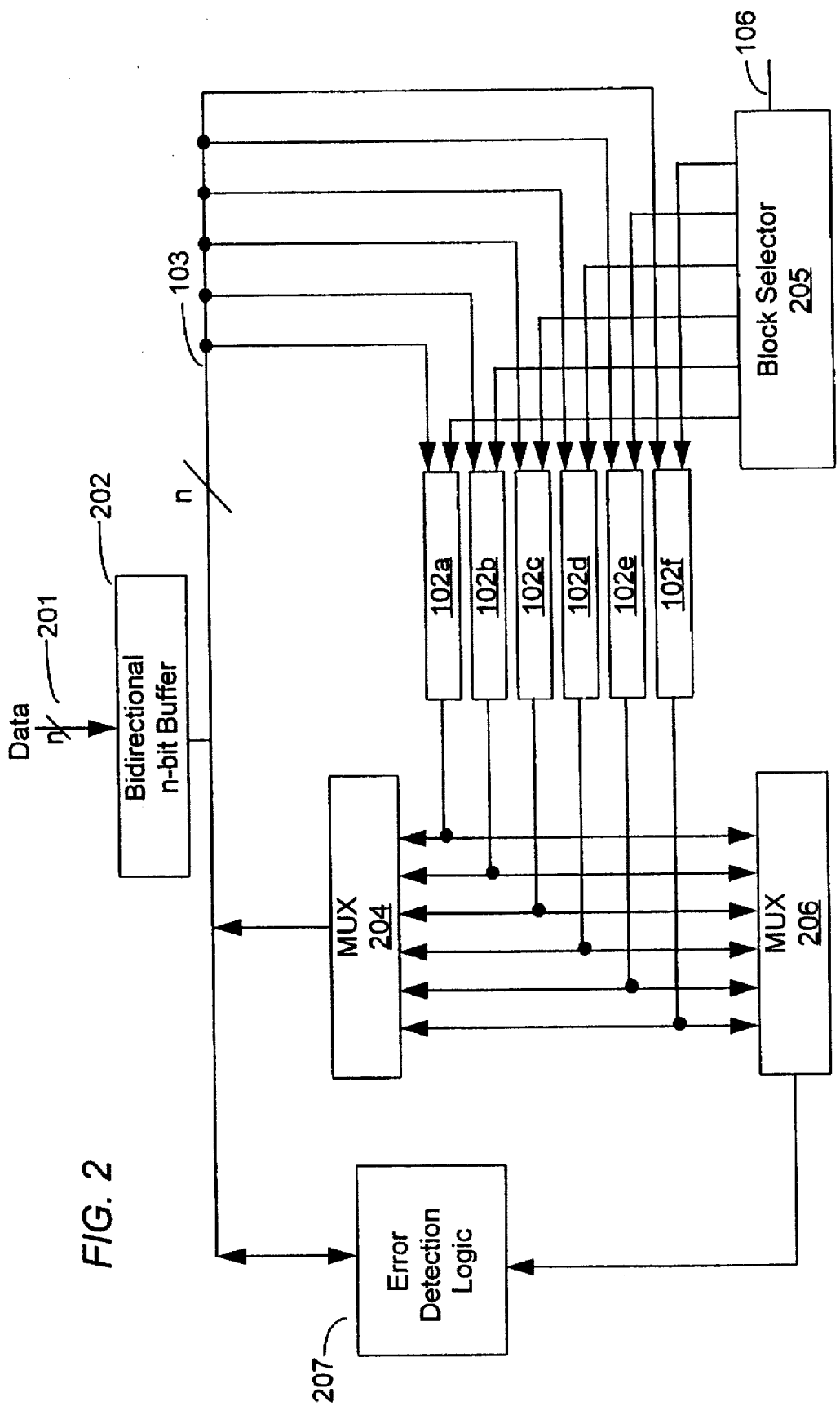
FIG. 2 shows detail of a block selector circuit in accordance with the present invention.

FIG. 2 illustrates a block selector circuit in accordance with the present invention. Block selector circuit 200 is preferably provided as a component of control circuit 101. Data line 201 is coupled directly or indirectly to I/O port 105 for receiving n-bits of data in parallel. The number of parallel bits received (n) can be as few as 1 and as many as the number of data wires in I/O port 105.

Data line 201 couples to a bi-directional n-bit buffer 202 which stores, conditions, and synchronizes data bits. Bi-directional n-bit buffer 202 preferably synchronously applies its contents to n internal data lines of internal data bus 103. Again, n can be as few as one and as large as the number of wires I/O port 105. Data bus 103 is a bi-directional bus which can accept data from bi-directional buffer 202 or input data into bi-directional buffer 202.

In one embodiment, some or all of the wires comprising data bus 103 are coupled to programmable logic blocks 102a–102f. Where data bus 103 is one bit wide (i.e., one wire wide), each of programmable logic blocks 102a–102f will be coupled in parallel to the single wire data bus 103. Where data bus 103 is more than one wire wide some of programmable logic blocks 102a–102f are preferably coupled to unique portions of or unique wires in internal data bus 103. This flexibility is afforded because programmable logic blocks 102a–102f are individually addressable via block selector 205.

Block selector 205 receives enable bus 106 (shown in FIG. 1). Block selector 205 is preferably a demultiplexor that decodes the enable data from enable bus 106 and supplies an enable signal to selected ones of programmable logic blocks 102a–102f.

In a particular example, internal data bus 103 is six bits wide or comprises six unique lines. Each of the six lines couples to a unique one of programmable logic blocks 102a–102f. In this example, normally block selector 205 could supply an enable signal to each of logic blocks 102a–102f simultaneously so that the configuration data streams would simultaneously load into programmable logic blocks 102a–102f thereby decreasing programming time. If one of blocks 102a–102f were faulty, block selector 205 would deselect the faulty block so that it would not load data bus 103 or otherwise interfere with the configuration data stream flowing to the other of programmable logic blocks 102a–102f.

In another embodiment, data bus 103 is less than six bits or wires wide, for example one bit wide. Here, programmable logic blocks 102a–102f are coupled in parallel to the single wire of data bus 103. Block selector 205 functions to select which of logic blocks 102a–102f are to receive the data stream currently flowing through data bus 103. It is possible, indeed likely in test and evaluation situations, that more than one of logical blocks 102a–102f will receive an identical data stream. In this case, block selector 205 can select more than one or all of logical blocks 102a–102f which will be simultaneously loaded with the same configuration data from the single data line 103. As described before, should one of logical blocks 102a–102f be faulty, it can be deselected so that is does not electrically load the single data line 103.

In another aspect of the present invention, each of logical blocks 102a–102f are coupled to multiplexor 204. Multiplexor 204 can select data coming from one of logical blocks 102a–102f and provide that data back to data bus 103. In this manner, data loaded into logical blocks 102a–102f can be loaded out via multiplexor 204 through bi-directional buffer 202 to external circuitry for evaluation or confirmation via data bus 201. This bi-directional use of internal data bus 103 and data bus 201 reduces the number of wires required and increases functionality of the control circuit 101 shown in FIG. 1.

Another feature that may be implemented in accordance with the present invention is coupling logic blocks 102a–102f to multiplexor 206. Multiplexor 206 selects one of logical blocks 102a–102f and supplies it to error detection logic 207. Error detection logic 207 is also coupled to internal data bus 103. In this manner, as data is loaded via data bus 103 to one or more of logic blocks 102a–102f it can be taken from the logic block after it is loaded and routed to error detection logic 207. Error detection logic 207 functions to compare data actually loaded into blocks 102a–102f with the data appearing on data bus 103. Should a discrepancy exist in the data loaded into the programmable logic blocks 102a–102f, an error signal is generated. Upon generation of an error signal, the faulty logic block can be further analyzed using the data output through multiplexor 204, or it can be permanently deselected by block selector 205 such that the faulty block is no longer available for use.

3. Logical Block Architecture.

Figure 3:
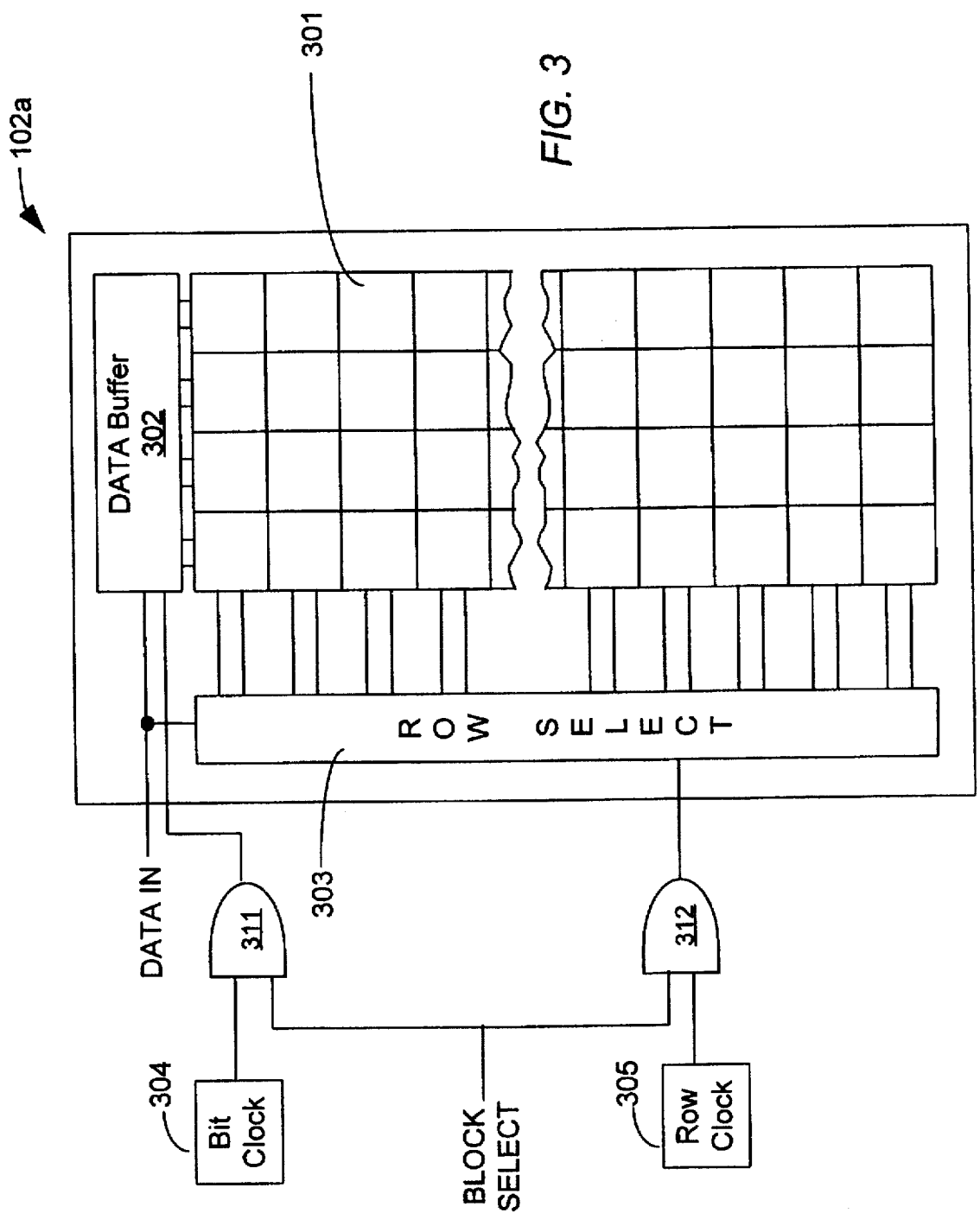
FIG. 3 shows detail of a preferred embodiment logic block of the PLD shown in FIG. 1 in block diagram form.
Figure 7:
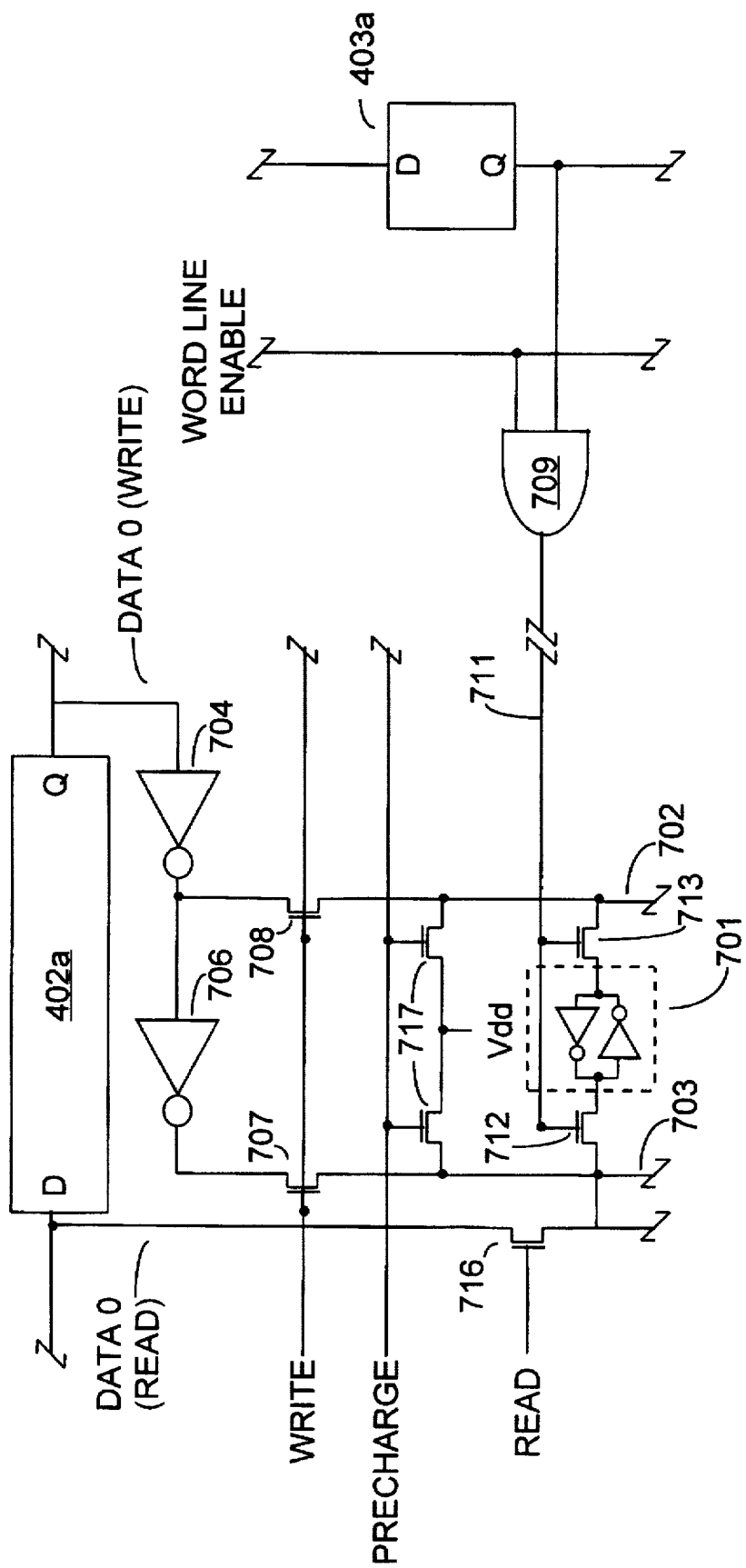
FIG. 7 illustrates a portion of a preferred logic block of FIG. 4 in greater detail.

FIG. 3 shows a block diagram of an example logic block structure in accordance with the present invention. For purposes of illustration, only logic block 102a is shown, however, it should be understood that each of logic blocks 102a-102f shown in FIG. 1 and FIG. 2 are substantially identical. Importantly, logic block 102a requires only four inputs to load configuration data into logic block 102a, although additional control lines discussed in reference to FIG. 7 are required to manipulate data within logic block 102a. In the preferred embodiment, the line labeled "DATA IN" comprises one or more data lines coupled to the internal data bus 103 shown in FIG. 2. Significantly, the number of lines in the DATA IN line can be as few as one and as many as the number of wires in data bus 103.

The BLOCK SELECT input to logic block 102a is generated by block selector 205 shown in FIG. 2. Bit clock 304 and row clock 305 are generated by control logic 101 and supplied via clock bus 104 shown in FIG. 1. Bit clock 304 is gated by the BLOCK SELECT signal by AND gate 311 before it is applied to Data register 302. In this manner, Data register 302 only receives a clock if the BLOCK SELECT line is asserted. Similarly, Row Clock 305 is gated via AND gate 312 by the BLOCK SELECT line so that row select register 303 is operational only when the BLOCK SELECT line is asserted.

A data register (or buffer) 302 is coupled to the DATA IN line as well as AND gate 311. Upon receiving the gated bit clock signal from AND gate 311, data register 302 loads data from the DATA IN line. One or more than one bit of data may be loaded each cycle of bit clock 304 depending on the particular architecture.

Similarly row select register 303 is coupled to the DATA IN line and gate 312 to receive the gated row clock signal. Data is loaded in from the DATA IN line in response to the gated row clock signal. Row select register 303 may load data one bit at a time, or multiple bits at a time depending on the architecture used. Row select register 303 may be any number of bits long, including one bit long.

Programmable block 102a comprises a plurality of programmable logic elements or tiles 301. Each logic element or tile 301 comprises programmable combinational logic and associated programmable interconnect circuitry. In a preferred embodiment, programmable tiles 301 are arranged in an array in a row and column fashion. Each programmable element or tile 301 includes a number of storage devices used to program the combinational logic and interconnects.

In a particular example, each programmable element 301 comprises approximately 100 storage devices. Each of the storage devices in the array of programmable elements 301 is individually addressable or uniquely identified within the programmable logic block 102a by its row address (selected by row select register 303), column location (selected by data register 302).

Data address lines (shown in FIG. 4) extend from data register 302 extend across all of the logic elements 301 within block 102a. Similarly, row select address lines (shown in FIG. 4) extend from row select register 303 across all of the logic elements 301 within block 102a.

An important advantage in accordance with the present invention is that the address lines extending from data register 302 and row select register 303 do not have to extend beyond or outside of the physical boundaries of programmable block 102a. This greatly reduces the number of wires that must extend across the entire width of PLD 100 (shown in FIG. 1). In a preferred embodiment the DATA IN line is a single wire. In this way, only a few lines (i.e., bit clock 304, row clock 305, data in, and block select) enter each programmable block 102a-102f. This great reduction in the number of lines extending across the entire chip 100 increases reliability and tolerance to defects significantly. Further, considering that bit clock 304 and row clock 305 are shared among many programmable logic blocks 102 it can be seen that the present invention provides a great reduction in the number of wires that must extend across the entire chip.

Figure 4:
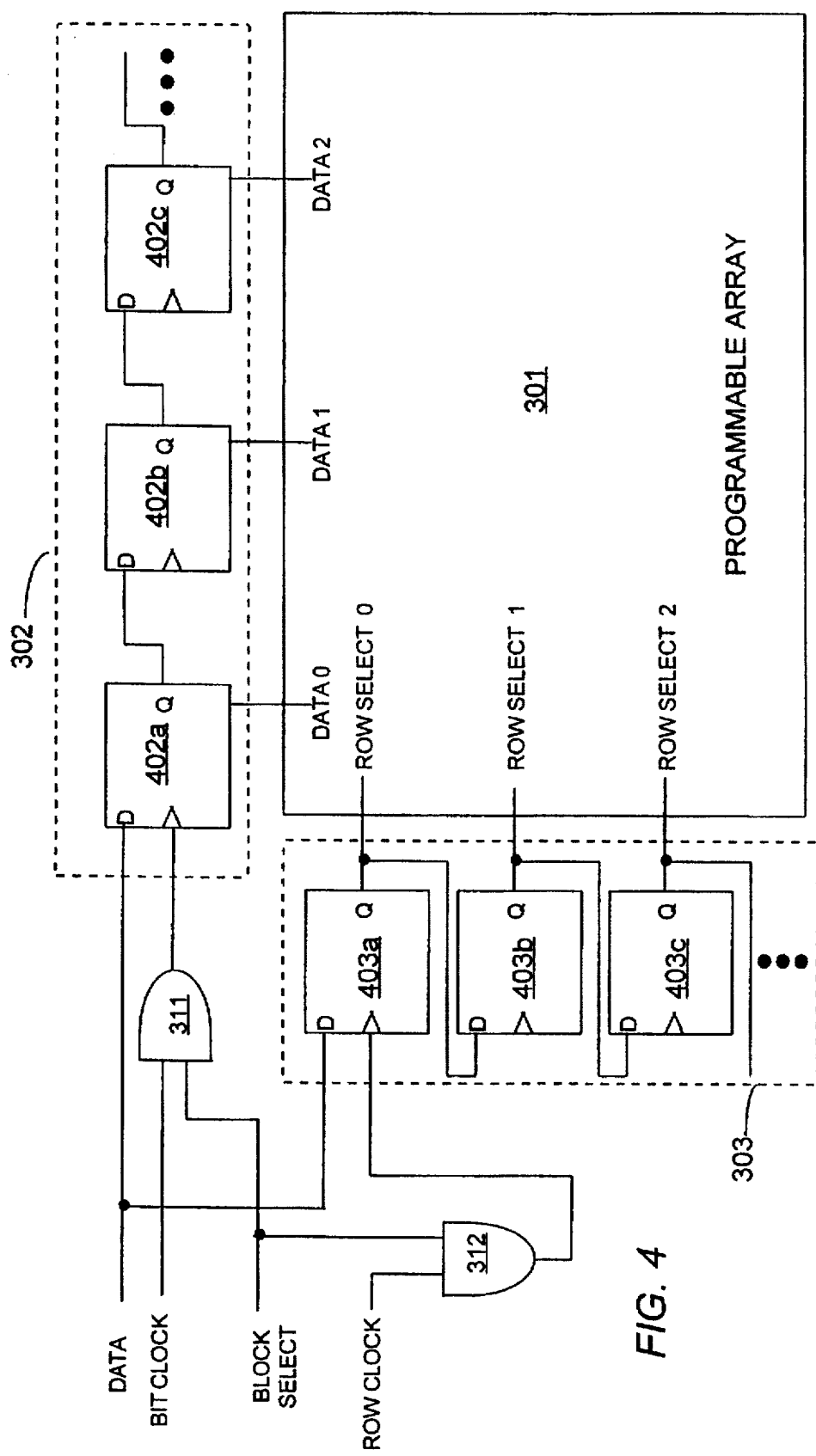
FIG. 4 shows the logic block of FIG. 3 in greater detail.

FIG. 4 illustrates in greater detail a portion of the preferred logic block 102a shown in FIG. 3. Programmable array 301 comprises an array of programmable storage devices that are individually or uniquely identified by ROW SELECT and DATA lines. Data register 302 is configured as a shift register comprising a plurality of serially connected flip-flops 402a, 402b, and 402c, etc. Data register 302 can be any length, including one bit long. In a preferred embodiment, a single data line is coupled to the D input of first flip-flop 402a. A BIT CLOCK line is connected through AND gate 311 to the clock input of each of flip-flops 402a–402c, although for ease of illustration only a single connection is shown. Hence, with each pulse of the BIT CLOCK line while the BLOCK SELECT line is asserted, one bit of information is shifted through data register 302.

Row select register 303 is implemented using serially connected flip-flops 403a–403c. Any number of flip-flops may be used to create row select register 303. Each flip-flop 403a–403c has a clock input coupled through AND gate 312 to the ROW CLOCK line. Each flip-flop 403a–403c generates one ROW SELECT address line. Hence, when the BLOCK SELECT line is asserted, each time bit clock 304 cycles, data is loaded from the DATA line into data register 302. Each time the row clock 305 cycles, data is loaded from the DATA line serially into row select register 303.

Data register 302 and row select register 303 may be loaded in any order. Upon completion of loading data register 302 and row select register 303 the data appearing on the data address lines DATA 0–DATA 2 in FIG. 4 is stored in the storage elements uniquely identified by the row address lines ROW SELECT 0–ROW SELECT 2. In this manner, programmable array 301 is configured to perform a particular operation. Data can be read from programmable array 301 in a similar manner using data register 302 and row select register 303 in a manner familiar to those with the design of read/write memory arrays.

4. Method of Operations.

Figure 5:
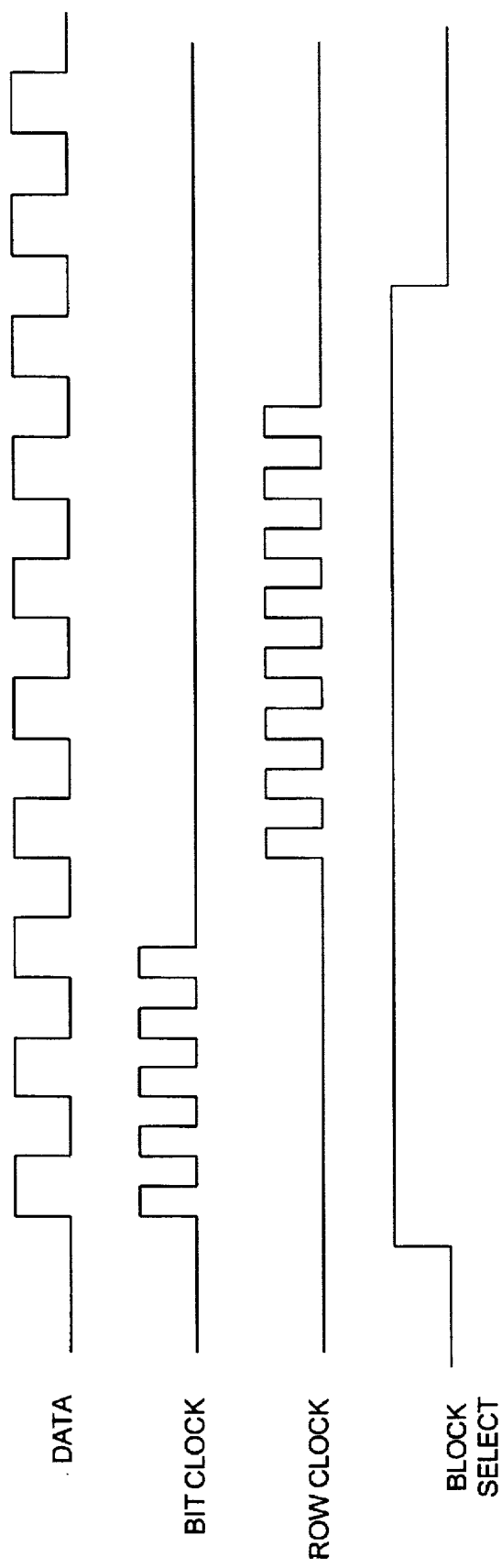
FIG. 5 shows a timing diagram useful in operating the PLD of the preferred embodiment.

FIG. 5 illustrates a timing diagram for the four signals entering block 102a shown in FIG. 3 and FIG. 4. For ease of description, the DATA signal illustrated comprises alternating logic 1's and logic 0's, although it should be understood that a practical data stream would comprise information particularly tailored for the circuit to be implemented in programmable array 301. Bit clock 304 (shown in FIG. 3) issues one pulse for each bit in the width of data register 302. That is to say, one pulse for each shift register 402a–402c that forms data register 302. In FIG. 5, five pulses are issued indicating a shift register with five bits. In practical circuits, shift register 302 will be tens or hundreds of bits wide.

Similarly, row clock 305 issues a pulse for each bit in the length of row select register 303. Although only eight pulses are shown, practical circuits would employ row select registers having tens or hundreds of bits. As indicated in FIG. 5, the BLOCK SELECT line is asserted before data arrives and before bit clock 304 and row clock 305 are activated. In FIG. 5, the bit clock is activated before the row clock, however, it should be understood that the bit clock pulses and row clock pulses can come in any order so long as the data appearing on the DATA line is valid during the particular clock cycle.

5. Alternative Embodiments.

Figure 6:
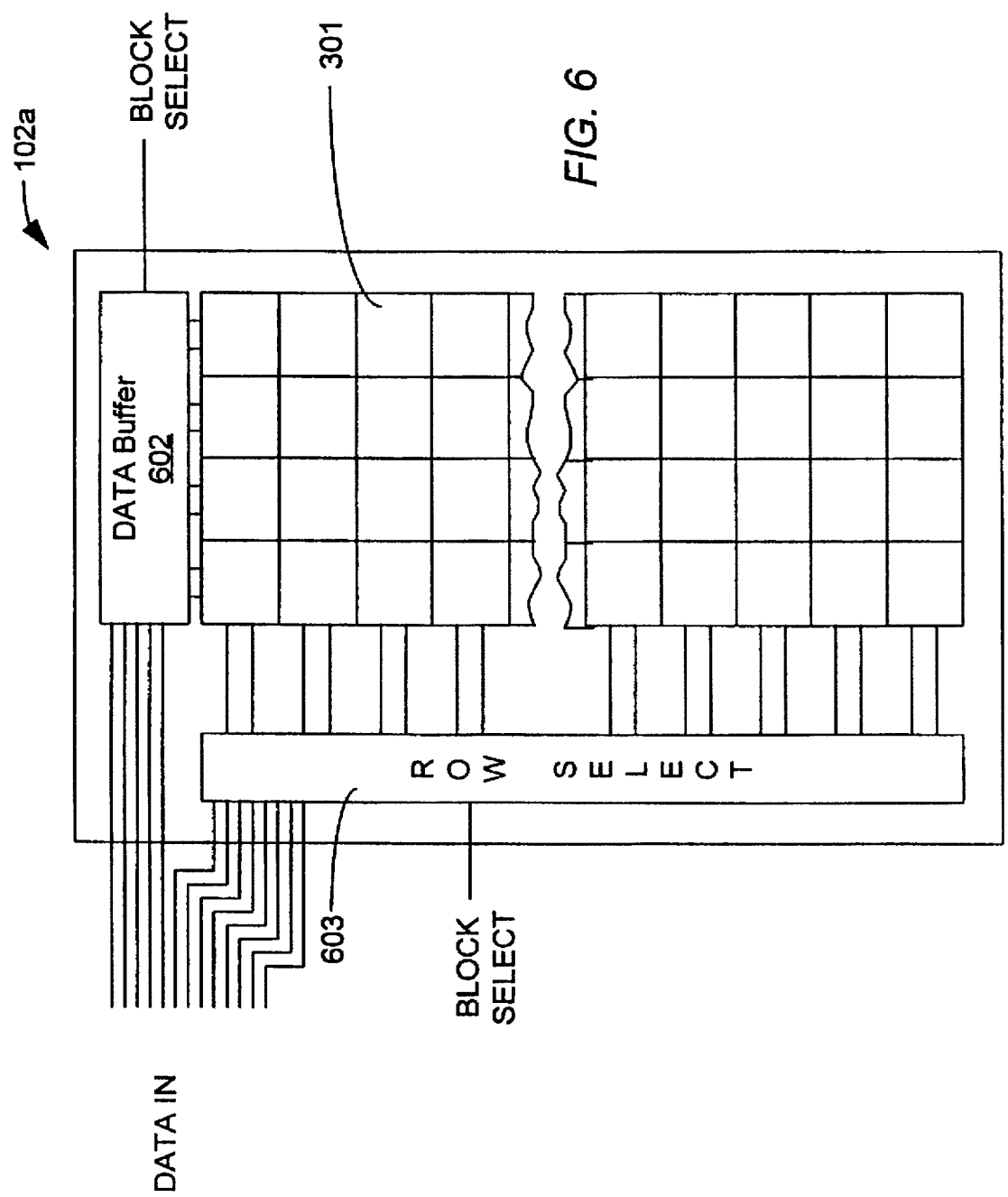
FIG. 6 shows an alternative embodiment logical block.

FIG. 6 illustrates an alternative embodiment logical block 102a in accordance with the present invention. In the logical block shown in FIG. 3, a single data line was used to apply data to data register 302 and row select register 303. In the implementation shown in FIG. 6, data register 602 and row select register 603 are addressed in parallel using a multi-line DATA IN bus. Where one data line is provided for each bit in row select register 603 and each bit in data register 602, there is no need for word and clock lines. It can be seen that in most applications, it is impractical to provide one DATA IN line for each bit in width, so the existence of row and bit clocks is preferable. However, it should be understood that any combination of parallel and serial loading into data register 602 and row select register 603 is possible in accordance with the present invention. So long as a PLD 100 (shown in FIG. 1) comprises a plurality of programmable logical blocks 102 that are segmented such that each programmable block is independently configured, the advantages in accordance with the present invention are achieved.

Figure 10:
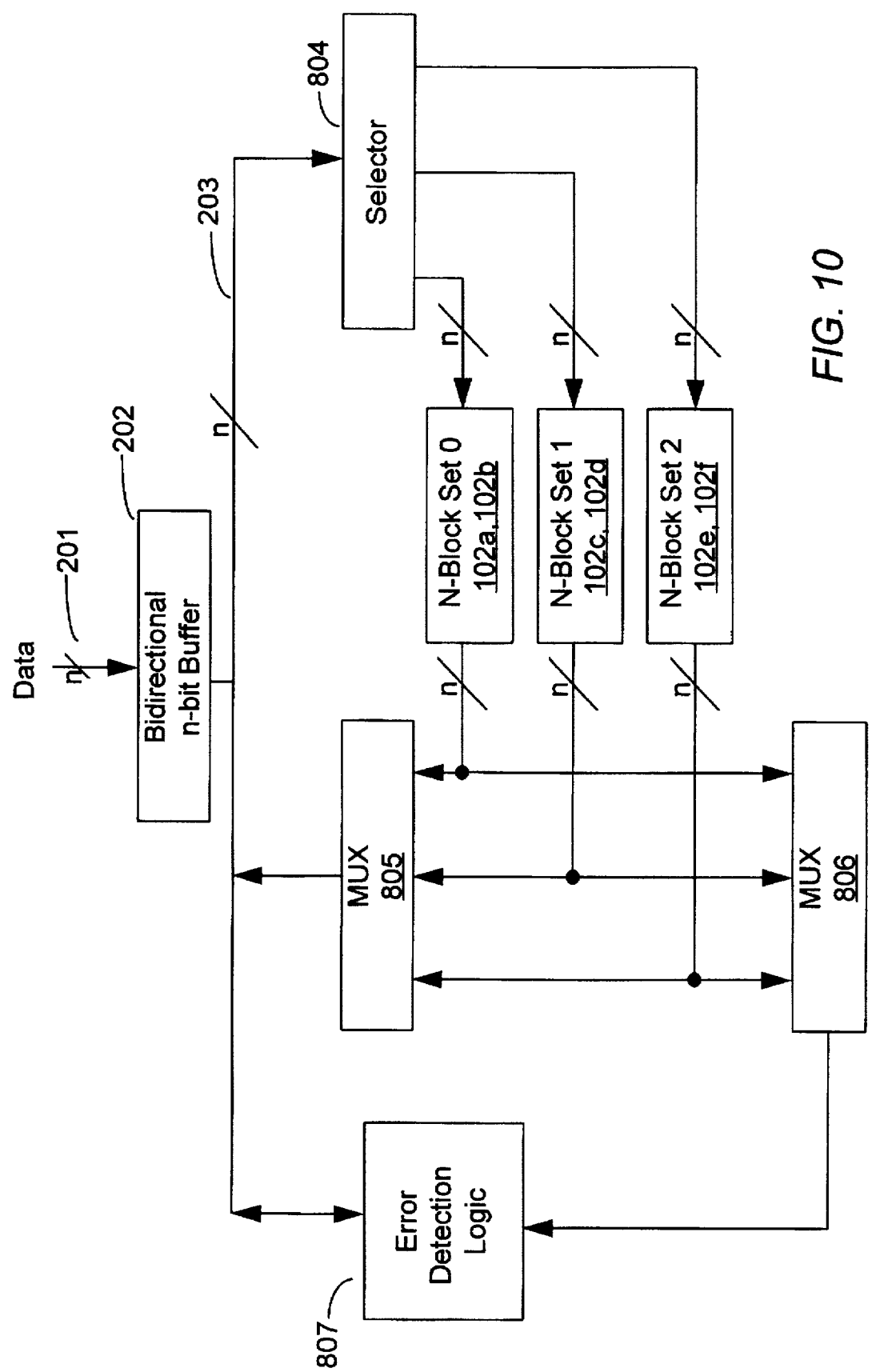
FIG. 10 shows an alternative block selector circuit in accordance with the present invention.

FIG. 10 illustrates a selector circuit useful when multiple blocks are addressed and loaded simultaneously. The multiple selector circuit of FIG. 10 resembles the selector shown in FIG. 2, and elements bearing the same designation in FIG. 2 are the same and function similarly to that described earlier.

The option shown in FIG. 7 includes a selector 804 coupled to the internal data bus 203. Selector 804 directs the n-lines of data bus 203 to n-lines of one of set 0, set 1, or set 2 of programmable blocks. Each set includes n blocks. In the example shown in FIG. 10 each set includes two blocks such as set 0 that includes blocks 102a and 102b. For example, where the number of data lines in internal data bus 203 is 2, selector 804 serves to direct two data lines to blocks 102a and 102b. One data line is coupled to block 102a and one is coupled to block 102b. Hence, blocks 102a and 102b are loaded simultaneously using each data line as a separate channel. In this manner, each block is independently configurable, however programming time is reduced because multiple blocks can be configured simultaneously. This takes full advantage of a wide data bus that is most likely otherwise provided on PLD 100 while still achieving the advantages of the present invention including segmented block architecture.

Like the embodiment described in reference to FIG. 2, the selector circuit shown in FIG. 10 allows data to be copied out of each n-block set through multiplexor 805 and bi-directional buffer 202 for examination by external circuitry. Also, multiplexor 806 and error detection logic circuit 807 operate to compare the loaded data with the data entering on internal data bus 203 to determine if an error exists in the programming or one of the logical blocks 102a–102f is faulty.

6. Preferred Implementation.

Figure 8:
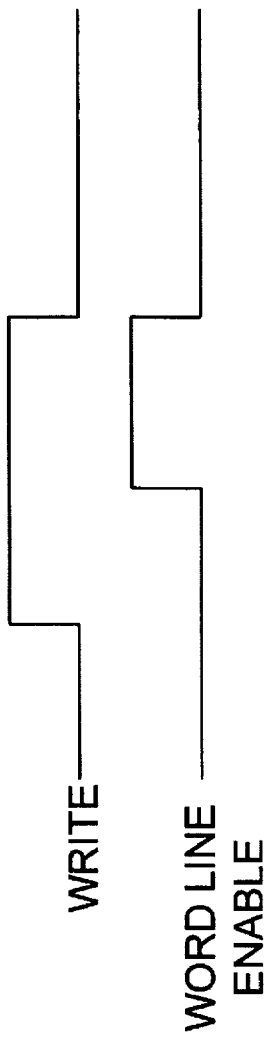
FIG. 8 and FIG. 9 show timing diagrams for control signals provided to the logic block of FIG. 7.
Figure 9:
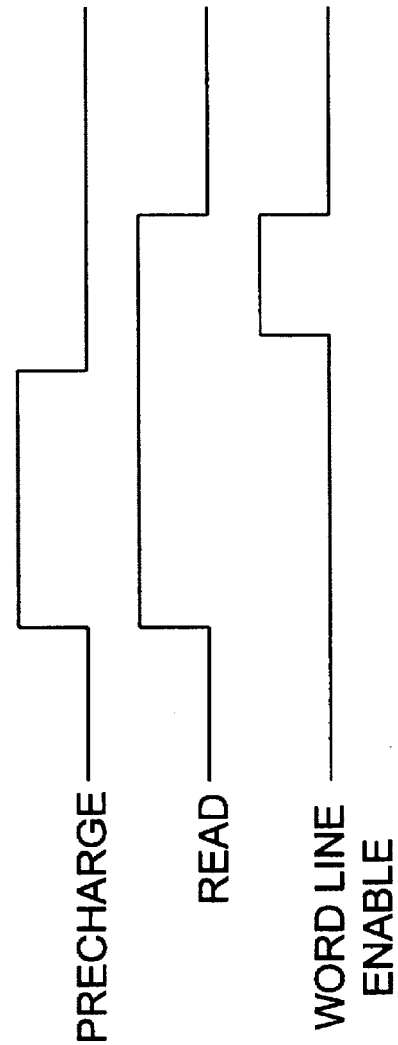

The preferred implementation of the block logic shown in FIG. 4 is best understood with reference to FIG. 7, FIG. 8, and FIG. 9. FIG. 7 illustrates detailed control lines used in a preferred embodiment to program a SRAM cells such as SRAM cell 701. Although a single SRAM cell 701 is shown, it should be understood that the control circuitry shown in FIG. 7 is shared among many SRAM cells as described hereinbefore. To ease understanding, control circuitry such as clock lines and block select lines that have already been discussed are not included in FIG. 7, however, it is understood that these elements are used in a practical circuit as described hereinbefore.

SRAM cell 701 stores one bit of data that is programmably coupled to non-inverting bit line 703 and inverting bit line 702. Data is written to SRAM cell 701 by driving bit lines 702 and 703 appropriately and activating programmable switches as set out in greater detail below. The stored data bit is read from SRAM cell 701 by coupling the reading circuitry to the non-inverted bit line 703.

In FIG. 7, a single flip-flop 402a (also shown in FIG. 5) of data register 302 is illustrated. Flip-flop 402 is loaded with one bit of data in the manner described with reference to FIG. 5 and FIG. 6. Also shown in FIG. 7 is a single flip flop 403a of row register 303. For purposes of illustration, it is assumed that flip-flop 403a contains a logic HIGH signal meaning that the row of which SRAM cell 701 is a part is currently addressed. The Q output of flip-flop 403a is coupled to one input of AND gate 709.

A non-inverted Q output of flip-flop 402a is coupled through inverter 704 and write transistor 708 to inverted bit line 702. The output of inverter 704 is also coupled through a second inverter 706 and write transistor 707 to the non-inverted bit line 703. During a write transaction, the WRITE control line is asserted to make write transistors 707 and 708 conductive. After the write control line is asserted, valid data is present on the bit lines 702 and 703.

Data is transferred from the bit lines 702 and 703 to SRAM cell 701 by assertion of a signal on word line 711. When the WORD LINE ENABLE control signal is asserted to a second data input of AND gate 709, word line 711 becomes a logic HIGH when addressed by flip flop 403a. In this manner, all of the SRAM cells 701 in a row of SRAM cells are simultaneously coupled to their respective bit lines 702 and 703. The relative timing of the WRITE control signal and the WORD LINE ENABLE signal are illustrated in the timing diagram of FIG. 8.

Preferably, data can also be read from SRAM cell 701 into flip-flop 402a. This functionality is provided by coupling the D input of flip-flop 402a through read transistor 716 to bit line 703. Alternatively, the inverted bit line 702 could be used so long as appropriate adjustments were made for signal polarity. During a read operation, assertion of a logic HIGH signal on word line 711 and a logic HIGH signal on read transistor 716 (in the manner discussed above) results in a transfer of data from SRAM cell 701 to flip flop 402a.

Optionally, the circuit is provided with precharge capability to improve performance. Precharge transistors 717 have one current carrying electrode coupled to the logic high power supply Vdd. Precharge transistors 717 each have the other of their current carrying electrodes coupled to one of bit lines 702 and 703. During a operation, assertion of the PRECHARGE signal makes both precharge transistors 717 conductive charging bit lines 702 and 703 to a preselected voltage. In the example shown in FIG. 7, the preselected voltage is Vdd. As shown in FIG. 9, the READ signal can be simultaneously applied to transistor 716 with the PRECHARGE signal. After a preselected time the voltage on bit lines 702 and 703 stabilizes and PRECHARGE can be deasserted. Subsequently, word line 711 is asserted causing bit lines 702 and 703 to take on a logic state determined by the bit stored in SRAM cell 701. Once the data is captured by flip-flop 402a, the READ signal is deasserted and the READ cycle is complete.

The details of the write and read operations in accordance with the preferred embodiment are provided for completeness only, and are not considered limitations on the teachings of the present invention. Many functional designs are known for writing data to and reading data from a memory cell such as SRAM cell 701. These are equivalent to the specific method described herein.

By now it should be appreciated that an improved programmable logic device including a plurality of programmable elements or tile organized in logical blocks has been provided. Each logical block comprises a unique subset of the plurality of programmable elements or tile. An independent address circuit is provided within each block thereby reducing the number of physical lines which must extend across the entire PLD thereby enhancing reliability and robustness of the PLD in accordance with the present invention.

We claim:

1. A programmable logic device (PLD) comprising:
   at least one control line for receiving at least one configuration data stream from a configuration data source;
   a control bus for routing the at least one configuration data stream from the control line;
   a plurality of programmable blocks;
   a plurality of storage devices within each of said plurality of programmable blocks for receiving and storing configuration data;
   a programming circuit within each of said plurality of programmable blocks coupled by programming lines to each of said plurality of storage devices, wherein each programming circuit couples only to the storage devices in the same block as the programming circuit;
   at least one data line entering each of said plurality of programmable blocks from the control bus and coupled to the programming circuit for coupling the configuration data stream to the programming circuit, the configuration data stream selecting at least one of the plurality of programmable blocks independently of any remaining programmable blocks in said plurality of blocks.

2. The PLD of claim 1 wherein failure of one of the plurality of programmable blocks does not affect any other of the programmable blocks in said plurality, the control bus, or the at least one control line.

3. The PLD of claim 1 wherein the programming circuit and at least one data line for each of said plurality of programmable blocks are electrically independent from the programming circuit and at least one data line of each other programmable block in said plurality.

4. The PLD of claim 1 wherein the plurality of storage devices are arranged as an array of N rows and M columns and the programming circuit further comprises:
   an N-bit row register coupled to the at least one data line and having row lines extending only from the row register across the M columns;
   an M-bit column register coupled to the at least one data line and having column lines extending from the column register only across the N-rows.

5. The PLD of claim 4 wherein the N-bit row register and M-bit column register are each coupled to at least two data lines and are loaded in parallel.

6. The PLD of claim 4 wherein the N-bit row register and M-bit column register are each coupled to only one data line and are loaded in serial.

7. A fault tolerant programmable logic device (PLD) on a single chip comprising:
   a plurality of programmable tiles organized in blocks wherein each block comprises a unique subset of the plurality of programmable tiles;
   a data bus extending to each of the blocks;
   independent address means for each block, the independent address means coupled to the data bus;
   a block enable line coupled to each block such that when the block enable line is asserted the address means of a selected block transfers data from the data bus to the unique subset of the plurality of programmable tiles in the selected block, and when the block enable line is deasserted the data bus is substantially electrically isolated from the independent address means of the selected block, the block enable lines coupled to the blocks being asserted and deasserted simultaneously so that any failed blocks are removed without affecting the operation of the remaining blocks on the single chip.

8. A programmable device (PLD) comprising:
   an array of switches;
   a plurality of logical blocks, wherein each logical block comprises a unique subset of the array of switches;
   a block select bus for providing a block select signal to selected ones of the plurality of logical blocks;
   a row register within each logical block, the row register responsive to the block select signal and having a plurality of row select lines supplying a row select signal to selected ones of the array of switches; and
   a data register within each logical block, the data register responsive to the block select signal and having a plurality of column lines supplying data to the selected ones of the array of switches.

9. The programmable device (PLD) of claim 8 further comprising:
   at least one data line coupled to the row register and data register of each of the plurality of logical blocks for supplying a configuration data stream to the logical blocks.

10. The programmable device of claim 8 wherein the row select lines and column lines are physically constrained in length to a single one of the plurality of logical blocks.

11. A programmable logic device (PLD) having a plurality of programmable logic blocks, each programmable logic block comprising:
   a plurality of storage devices for receiving and storing configuration data;
   a block enable line for receiving a block enable signal;
   at least one data line for supplying configuration data;
   a data register coupled to the at least one data line and responsive to the block enable signal for temporarily storing a portion of the configuration data; and
   an address circuit coupled to the at least one data line and responsive to the block enable signal for causing a selected number of the plurality of storage devices in the block to store the portion of configuration data from the data register.

12. A programmable logic device (PLD) having a plurality of programmable logic blocks, each programmable logic block comprising:
   a plurality of storage devices for receiving and storing configuration data;
   a block enable line for receiving a block enable signal;
   at least one data line for supplying configuration data;
   a data register coupled to the at least one data line and responsive to the block enable signal for temporarily storing a portion of the configuration data; and
   an address circuit coupled to the at least one data line and responsive to the block enable signal for causing a selected number of the plurality of storage devices in the block to store the portion of configuration data from the data register;
   a first clock line;
   a second clock line;

a first AND gate receiving the first clock line and the block enable signal, the first AND gate generating a first gated clock signal;

a second AND gate receiving the second clock line and the block enable signal, the second AND gate generating a second gated clock signal;

said data register comprising:

(a) a first shift register having a data input coupled to the at least one data line and having a first clock input receiving the first gated clock signal;

(b) a plurality of address lines extending from each bit of the first shift register and terminating at the width of the programmable logic block;

(c) a second shift register having a data input coupled to the at least one data line and having a second clock input receiving the second gated clock signal;

(d) a plurality of column lines extending from each bit of the second shift register and terminating at the length of the programmable logic block.

13. A programmable logic device (PLD) comprising:

a plurality of programmable tiles, each tile comprising a plurality of programmable storage devices;

a plurality of logic blocks, wherein each logic block comprises a unique set of the programmable tiles;

a first clock line coupled to each logic block;

a second clock line coupled to each logic block;

a data line coupled to each logic block;

a plurality of block select lines wherein each of the plurality of block select lines is coupled to only one logic block; and an address circuit within each logic block responsive to the first clock line, the second clock line, the data line, and the block select line, wherein the address circuit has a plurality of address lines extending only to each of the programmable tiles within the logic block, the address circuit capable of storing data received from the data line when a preselected signal is received on the block select line.

14. The PLD of claim 13 further comprising:

an enable line coupled to each logic block wherein the stored data is transferred to the plurality of programmable storage devices within the logic block upon assertion of an enable signal on the enable line.

15. A method for loading a configuration data stream into a programmable logic device having a plurality of fault tolerant blocks on a single chip with each block having a plurality of storage devices, the method comprising the steps of:

selecting at least one block of storage devices of the programmable logic device independently of any remaining blocks in said plurality of blocks so that if any of the plurality of blocks are faulty the remaining blocks on the single chip can be selected;

addressing selected storage devices within the at least one selected block;

loading a portion of the configuration data stream into the addressed storage devices; and repeating the selecting, addressing, and loading steps until the configuration data stream is exhausted.

16. The method of claim 15 wherein the step of addressing further comprises:

transferring a row address from the configuration data stream into the selected block to address a group of storage devices in the selected block.

17. The method of claim 16 wherein the step of loading further comprises:

transferring column data from the configuration data stream into a register within the selected block; and transferring the column data from the register to the group of the selected storage devices.

18. The method of claim 15 wherein the selecting step comprises selecting more than one block of storage devices.

19. The method of claim 15 further comprising the steps of:

detecting when an error occurs during the loading step; and isolating at least one block in which the detected error occurs from the remainder of the plurality of blocks.

* * * * *